United States Patent [19]  
Behringer et al.

[11] Patent Number: 4,554,458  
[45] Date of Patent: Nov. 19, 1985

[54] ELECTRON BEAM PROJECTION LITHOGRAPHY

[75] Inventors: Uwe Behringer, Ammerbuch; Harald Bohlen; Werner Kulcke, both of Boeblingen; Peter Nehmiz, Stuttgart, all of Fed. Rep. of Germany

[73] Assignee: International Business Machines Corporation, Armonk, N.Y.

[21] Appl. No.: 632,997

[22] Filed: Jul. 20, 1984

[30] Foreign Application Priority Data

Aug. 11, 1983 [EP] European Pat. Off. ........ 83107926.4

[51] Int. Cl.4 ..................... H01J 37/317; H01J 40/16
[52] U.S. Cl. .................................. 250/492.2; 313/542
[58] Field of Search ..................... 250/492.2; 313/523, 313/539, 541, 542

[56] References Cited

U.S. PATENT DOCUMENTS 3,832,561 8/1974 O'Keefe ........................... 250/492.2
4,460,831 7/1984 Oettinger et al. ................ 250/492.2

Primary Examiner—Alfred E. Smith  
Assistant Examiner—Jack I. Berman  
Attorney, Agent, or Firm—Robert E. Sandt

[57] ABSTRACT

The photoresist film 12 on the surface of a wafer 11 is exposed through the shadow pattern which is generated by a transmission mask 13 arranged a short distance therefrom when the mask is subjected to a large-area electron beam. The source of the electron beam is an unstructured photocathode 16 on an ultraviolet transparent carrier such as, quartz glass 17 which is subjected to UV radiation from the backside. The electrons exiting from layer 16 are accelerated by a homogeneous electric field 14 towards the mask 13 and shaped to form a homogeneous collimated electron beam. By means of laterally positioned electrostatic deflecting electrodes 19a, 19b, the entire electron beam can be tilted relative to the wafer for adjusting the mask pattern.

7 Claims, 1 Drawing Figure

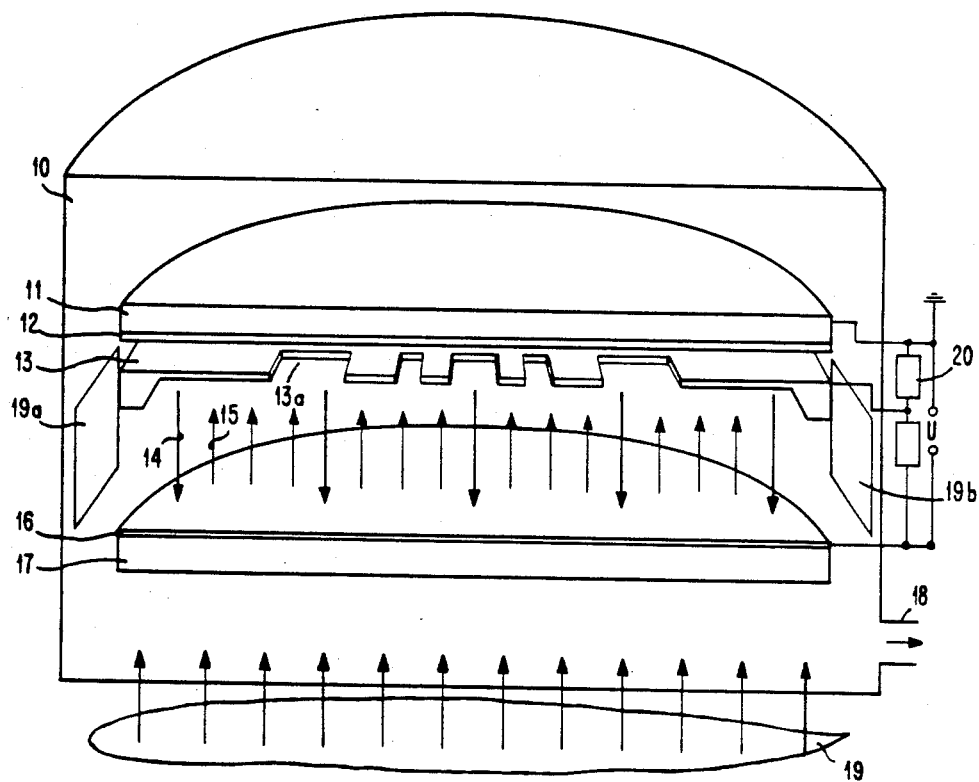

ELECTRON BEAM PROJECTION LITHOGRAPHY

Description

1. Technical Field

The invention relates to apparatus for electron beam projection lithography.

2. BACKGROUND

The progressive miniaturization of integrated circuits necessitates the production of ever smaller structures, e.g., conductor widths. Photolithography, which is presently being used almost exclusively, is confined to structures of about 1 $\mu$. This is due to diffraction effects and the fact that the depth of field is very small. Although corpuscular beam optical lithographic methods using, for example, electron or ion beams, permit the production of finer structures, their practical application is impeded by sizeable technical and economic problems, for example, with respect to the desired high throughput of semiconductor wafers to be exposed, the apparatus required or the relative adjustment between mask and wafer. A survey of the presently investigated systems and methods is contained in the article by H. Braun "Lithographie mit Licht-, Elektronenund Roentgenstrahlen" in Physik in unserer Zeit, Vol. 10, 1979, No. 3, pp. 68 et seq.

Of the particle beam optical systems, those operated by electron beams are being used most widely. For applications involving large quantities, such as during the production of photolithographic masks, so-called scanning systems are used which operate without a mask and generate the desired pattern in the manner of a TV image or according to the so-called faster vector scan method. However, for mass-producing integrated circuits, these systems are too slow.

Although electron beam lithographic systems using shadow projection (proximity printing), as described in the German Patent Application No. p. 27 39 502.4 or in the article by H. Bohlen et al in Proc. 9th Int. Conf. Electron and Ion beam Science and Technology, Vol. 80-6, 1980, p. 244, permit a high hourly throughput of wafers, as, similar to known photolithography, entire masks are imaged on to the wafer, the deflection of the electron beam across the individual parts of the mask necessitates a relatively expensive beam guide and control system, particularly if relatively large masks are used.

A further projection method using electron beams has become known under the term cathode projection and has been described by T. W. O'Keeffe et al in Solid State Electronics, Vol. 12, 1969, p. 841 et seq. In lieu of a mask transparent to electronic, it provides for a large-area photocathode to be structured through a mask pattern, and the electrons exiting during radiation with ultraviolet light to be imaged on to the wafer with the aid of an electron optical imaging field. Despite its apparent simplicity, this system has not been used in practice, as imaging errors impair the accuracy needed; such errors are caused amongst others by the wafer itself which forms the anode in this system and which impairs the imaging characteristics by its inevitable unevenness.

OBJECTS OF THE INVENTION

Therefore, it is the object of the present invention to provide an electron beam projection system of the previously described kind which while having a simple design permits a high image fidelity and a high throughput of the wafers to be exposed.

BRIEF DESCRIPTION OF THE DRAWINGS

The single drawing schematically depicts a representative structure of the invention.

DESCRIPTION OF THE PREFERRED EMBODIMENT

The preferred example of the invention proposes that the known cathode projection systems be modified such that an unstructured photocathode is used which upon exposure to ultraviolet light emits a homogeneous electron beam of a wide diameter which under the influence of an electric field is collimated and directed on to a mask transparent to electrons and positioned immediately in front of the wafer.

This system thus does not require imaging electron optical elements involving extensive and costly manufacturing means; the inevitable imaging errors occurring even in such instances are eliminated. As imaging errors are generally specific of the respective exposure system used, known lithographic devices are not readily exchangeable. This does not apply to the proposed system. Thus, globally speaking, a very simple and compact electron beam lithographic system is obtained which nevertheless affords a high throughput, as masks with a large diameter may be used. According to an embodiment of the invention, fine positioning is provided between mask and wafer, which is obtained by electronically inclining the electron beam emanating from the photocathode. Lithographic systems or methods which expose only part of the wafer and past which the wafer is moved in steps (so-called step-and-repeat methods) may be realized by means of the system proposed herein. The line widths obtainable by means of the proposed system are in the range of 0.5 $\mu$.

The invention will be described in detail below with reference to an embodiment illustrated in the accompanying drawing showing a schematic of the typical design of an electron beam lithographic system with an unstructured photocathode.

In a vacuum dome 10, which through a connector 18 is linked to suitable vacuum pumps, a semiconductor wafer 11 is arranged, one surface of which is covered with a thin film 12 of a photoresist, whose characteristics of solubility may be changed by exposure to electron beams. The pattern to be generated in the photoresist film 12 is determined by the holes 13a of a transmission mask 13 arranged a short distance away from and parallel to the surface of the wafer; a typical distance value is about 0.5 mm.

The transmission mask 13 consists of a very thin silicon layer, whose peripheral areas are thickened for mechanical stability. The areas 13a transparent to electrons consist of holes generated in the silicon layer by ion etching, for example. Such electron beam lithographic masks are known from the art and are described, for example, by J. Greschner et al in Proc. 9th Int. Conf. Electron and Ion Beam Science and Technology, Vol. 80-6, 1980, p. 152 et seq. or in the German Patent Application No. P. 29 22 416.6. The previously proposed shadow projection methods comprising such masks used an electron beam with a diameter that was much smaller than the entire mask. For exposing the entire mask, this beam had to be deflected in a raster form. Electron beam optical system or large beam diameters involve, as is known, substantial means and expenditure.

In contrast to this, the present invention provides for large-area illumination of the transmission mask 13, using a photocathode with a correspondingly large surface. The photocathode consists of a thin layer 16 of material with high photoemission, such as example, palladium or cesium iodide, arranged on a carrier 17 which in turn is transparent to ultraviolet light 19 directed from the back of the carrier on to the photosensitive layer (for example, through a suitable hole in the vacuum dome 10).

Between the photoemissive layer 16 on the one hand and the wafer 11 on the other a DC voltage of 5 to 10 kV is applied such that the photoemissive layer acts as a cathode and the photoelectrons exiting from it (marked by arrow 15) are accelerated by the resultant homogeneous electric field (marked by arrow 14). The planar electric field 14 simultaneously serves to collimate the electron beam 15 which thus is perpendicularly incident on the mask 13, generating a sharp shadow without half-shadow areas. To avoid the mask 13 interfering with the planar and homogeneous electric field 14, the mask is connected to a potential corresponding to an equipotential area of the field 14, using, for example, a voltage divider 20.

The basic difference between the system according to the invention and known cathode beam projection systems thus consists in the mask being separated from the photoemissive layer; the latter is completely unstructured and produced to be homogeneous. By positioning the exposure mask immediately in front of the wafer, no imaging conditions have to be observed which would be difficult to fulfill if the electrons exiting from the photolayer 16 were to be imaged dot-by-dot over the relatively large distance up to the surface of the wafer 11. In addition to the collimation effect of the electric field 14, which produces a parallel electron beam, no further electron optical imaging means are required.

Deformations of the electric field resulting from the unevenness of the wafer are also largely avoided by the proposed electric potential of the transmission mask. Thus the system according to the invention combines the advantages but eliminates the disadvantages of previously known electron beam projection systems, i.e., the accuracy of mask projection is high and cathode projection is simple.

The configuration illustrated in the figure, where the size of the photocathode substantially corresponds to the size of the mask, is particularly expedient for lithographic processes requiring only one mask step, as, for example, with magnetic domain storages, known as bubbles. However, for other lithographic manufacturing processes, in particular for semiconductor technology, several masks have to be projected on to the same wafer at different times after the mask has been aligned to structures already existing on the wafer. For facilitating such registration, the vacuum dome 10 is provided with additional electrostatic deflecting electrodes 19a, 19b arranged parallel to the direction of the electric field and to which electric potentials of a suitable magnitude may be applied. By means of this system, the homogeneous electron beam emanating from the photocathode may be tilted as a whole, so that the shadow image of the mask is displaced on the wafer 11 by a distance proportional to the deflection voltage. Thus, fast fine registration is possible.

For improving further the registration facilities, the size of the photocathode is chosen to be such that it does not correspond to the size of the entire mask 13 but only to one or a few circuits which form chips later on. The entire surface of the wafer 14 is then exposed by shifting the exposure system in steps relative to the wafer surface (so-called step-and-repeat method). Prior to exposure, fine registration, which also compensates for local distortions, is effected with the aid of the deflecting electrodes 19a, 19b. For registration, prior art methods may be used, such as detecting X-rays triggered by the electron beam from special registration marks.

While the invention has been particularly shown and described with reference to the preferred embodiment thereof, it will be understood by those skilled in the art that various changes in form and details may be made therein without departing from the spirit and scope of the invention.

What is claimed is:

1. Apparatus for exposing a resist-coated wafer to a predetermined pattern of electrons, comprising;
   a. A source of ultraviolet radiation;
   b. A photoemissive cathode having a substrate transparent to U.V. radiation and a homogeneaus photoemissive coating on the substrate surface facing away from said source, and illuminated thereby, wherein the surface of said wafer coated with resist faces said cathode; and
   c. An apertured mask having an aperture with a pattern of electron transparent and opaque regions corresponding to said predetermined pattern, the said mask being positioned spaced apart from the photemissive cathode and closely adjacent to said resist surface;
whereby the patterned beam of electrons passed by said mask will selectively alter the state of said resist to replicate said predetermined pattern.

2. The apparatus of claim 1 wherein means are provided to produce a potential difference between said cathode and said wafer to collimate said electron beam.

3. The apparatus of claim 1 or 2 wherein the area of said photocathode is substantially coextensive with the apertures in said mask.

4. The apparatus of claim 3 wherein the areas of the cathode, the apertures in said mask, and the wafer are substantially coextensive.

5. The apparatus of claim 3 wherein the area of the wafer is substantially greater than the areas of said apertures and said photocathode, and means are provided for imparting relative motion between said wafer and said mask, whereby discrete areas of said wafer are successively exposed to the patterned electron beam passed by the apertures in said mask.

6. The apparatus as defined in claims 1 or 2 wherein means are provided for applying a potential difference to said mask substantially equal to the value of the potential gradient at the location of the mask.

7. The apparatus of claim 1 or 2 wherein deflection plates are provided to deflect said electron beam.

* * * * *